(12) United States Patent
Eid et al.

(10) Patent No.: US 10,186,465 B2
(45) Date of Patent: Jan. 22, 2019

(54) PACKAGE-INTEGRATED MICROCHANNELS

(71) Applicant: Intel Corporation, Santa Clara, CA (US)

(72) Inventors: Feras Eid, Chandler, AZ (US); Adel A. Elsherbini, Chandler, AZ (US); Henning Braunisch, Phoenix, AZ (US); Yidnekachew S. Mekonnen, Chandler, AZ (US); Krishna Bharath, Chandler, AZ (US); Mathew J. Manusharow, Phoenix, AZ (US); Aleksandar Aleksov, Chandler, AZ (US); Nathan Fritz, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/748,138

(22) PCT Filed: Sep. 25, 2015

(86) PCT No.: PCT/US2015/052431
§ 371 (c)(1),
(2) Date: Jan. 26, 2018

(87) PCT Pub. No.: WO2017/052636
PCT Pub. Date: Mar. 30, 2017

(65) Prior Publication Data
US 2018/0226310 A1    Aug. 9, 2018

(51) Int. Cl.
*H01L 23/14*        (2006.01)
*H01L 23/12*        (2006.01)
(Continued)

(52) U.S. Cl.
CPC .......... *H01L 23/147* (2013.01); *H01L 21/486* (2013.01); *H01L 21/4871* (2013.01);
(Continued)

(58) Field of Classification Search
CPC ............................ H01L 23/147; H01L 23/473
See application file for complete search history.

(56) References Cited

U.S. PATENT DOCUMENTS

| 2001/0001897 A1 | 5/2001 | Zhao et al. |
| 2004/0188648 A1 | 9/2004 | Xie et al. |

(Continued)

OTHER PUBLICATIONS

International Search Report and Written Opinion for International Patent Application No. PCT/US2015/052431 dated Jun. 22, 2016, 12 pgs.

(Continued)

*Primary Examiner* — Walter H Swanson
(74) *Attorney, Agent, or Firm* — Schwabe, Williamson & Wyatt, P.C.

(57) ABSTRACT

Embodiments of the invention include package substrates that include microchannels and methods of making such package substrates. In an embodiment, the package substrate may include a first package layer. In some embodiments, a bottom channel wall may be formed over the first package layer. Embodiments may also include a channel sidewall that is formed in contact with the bottom channel wall. An organic dielectric layer may be formed over the first package layer. However, embodiments include a package substrate where the dielectric layer is not present within a perimeter of the channel sidewall. Additionally, a top channel wall may be supported by the channel sidewall. According to an embodiment, the top channel wall, the channel sidewall, and the bottom channel wall define a microchannel.

25 Claims, 8 Drawing Sheets

(51) Int. Cl.
*H01L 23/473* (2006.01)
*H01L 21/48* (2006.01)
*H01L 23/538* (2006.01)
*H01L 23/492* (2006.01)

(52) U.S. Cl.
CPC ............ *H01L 23/12* (2013.01); *H01L 23/473* (2013.01); *H01L 23/492* (2013.01); *H01L 23/5389* (2013.01)

(56) References Cited

U.S. PATENT DOCUMENTS

| | | | |
|---|---|---|---|
| 2004/0253123 A1 | 12/2004 | Xie et al. | |
| 2005/0039885 A1* | 2/2005 | Vaidyanathan | F28F 7/02 165/80.4 |
| 2006/0002087 A1* | 1/2006 | Bezama | F28F 3/12 361/699 |
| 2006/0103011 A1* | 5/2006 | Andry | H01L 23/473 257/707 |
| 2007/0131659 A1* | 6/2007 | Durocher | H01L 21/4871 219/121.6 |
| 2008/0171134 A1 | 7/2008 | Xie et al. | |
| 2009/0227060 A1 | 9/2009 | Tan | |
| 2011/0316147 A1* | 12/2011 | Shih | H01L 21/486 257/737 |
| 2015/0194413 A1* | 7/2015 | Lee | H01L 25/18 257/676 |

OTHER PUBLICATIONS

International Preliminary Search Report for International Patent Application No. PCT/US2015/052431, dated Apr. 5, 2018, 11 pages.

* cited by examiner

PACKAGE-INTEGRATED MICROCHANNELS

CROSS-REFERENCE TO RELATED APPLICATION

This patent application is a U.S. National Phase Application under 35 U.S.C. § 371 of International Application No. PCT/US2015/052431, filed Sep. 25, 2015, entitled "PACKAGE-INTEGRATED MICROCHANNELS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microchannels integrated in semiconductor packages and methods for manufacturing such devices.

BACKGROUND OF THE INVENTION

Microchannels have been formed on non-permeable substrates such as semiconductor substrates, sapphire substrates, and glass substrates. The microchannels are able to be used in microfluidic devices that can have many different functionalities. For example, microfluidic devices have been used for air sampling for environmental monitoring and bodily fluid delivery for biosensing applications, to name a couple. Additionally, the microchannels may be used for thermal management applications on the substrate, such as liquid cooling. However, these applications currently cannot be implemented on packaging substrates. Microchannels are not currently possible in packaging substrates because they require a channel that completely seals the fluid within the channel from the organic dielectrics used as build up layers. When the fluid is not completely sealed, the organic dielectric material will absorb some of the fluid being delivered through the microchannel. Absorption of the fluid can result in performance degradation of the microfluidic device and potential package failure (e.g reliability problems, delamination between layers, etc.).

Furthermore, current packaging substrate manufacturing processes cannot produce completely sealed channels because the interconnect vias and other features are formed in the dielectric layers with laser drilling processes. Due to laser limitations, these features can only be circular holes or discontinuous lines which are later plated to produce vias. Accordingly, features fabricated with laser patterning are not able to create continuous walls that can form the channel. Additionally, the current laser drilling operations rely on a plating operation that is not capable of forming the hollow channel interiors that are needed to allow for the fluid to flow.

Thus, improvements are needed in the area of packaging substrate fabrication in order to form microchannels.

DETAILED DESCRIPTION OF THE INVENTION

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, microchannels can provide additional functionalities to the devices in which they are formed. Accordingly, embodiments of the present invention include package substrates that include microchannels and methods of forming the microchannels in the package substrates. In packaging substrates, the dielectric layers are not able to provide a seal to prevent the fluid from escaping the channel. As such, embodiments of the invention include methods for forming a lining over the dielectric layers that can provide a non-permeable seal. For example, a metallic material may be formed over the dielectric layers. Furthermore, embodiments of the invention include a lining formed over the dielectric layers that is hollow in order to allow for the fluid to flow. Accordingly, embodiments of the invention may utilize a sacrificial material to serve as a core on which the upper wall of the channel may be formed. The sacrificial material may then be removed in order to form the hollow channel.

Figure 1A:
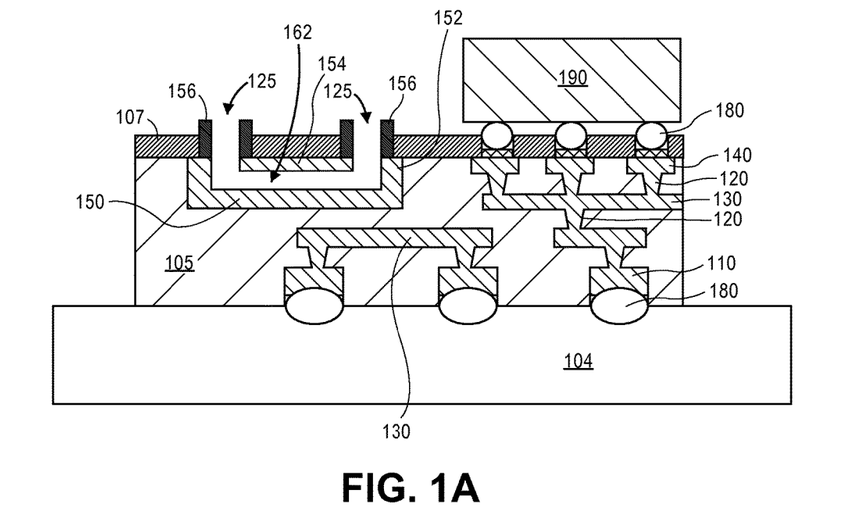
FIG. 1A is a cross-sectional illustration of a package substrate that includes a microchannel according to an embodiment of the invention.

A package substrate with a microchannel according to an embodiment of the invention is illustrated in the cross-sectional view in FIG. 1A. In the illustrated embodiment, a packaged device 100 is shown. The packaged device includes a semiconductor die 190 that is electrically coupled to a printed circuit board (PCB) 104 by one or more solder bumps 180, conductive lines 130, pads 140, 110, and vias 120 that are formed through one or more dielectric layers 105. In the illustrated embodiment, the dielectric layers 105 are illustrated as a single material layer, however it is to be appreciated that the dielectric layers may include a plurality of layers and are represented as a single layer here in order to not unnecessarily obscure the illustrated embodiment. In addition to a flip-chip mounted die 190, embodiments of the invention may also include a die 190 that is embedded in the dielectric layers 105 or wirebonded. Additional embodiments may include a packaged device 100 that includes a plurality of dice 190 that are mounted to a surface of the dielectric layers 105 and/or embedded in the dielectric layers 105.

Embodiments of the invention further include one or more microchannels 162 formed in the dielectric layers 105. The microchannels 162 include a hollow pathway through which a fluid or gas may flow. Embodiments of the invention prevent the fluid from being absorbed by the organic dielectric material by forming a non-permeable layer over dielectric material 105. In one embodiment, the non-permeable layer is a metallic material. In order to improve the manufacturability of the microchannel, the non-permeable layer may be the same material that is used to form the conductive lines 130, vias 120, and pads 110, 140 in the rest of the packaged device 100. For example, in the illustrated embodiment, a bottom channel wall 150 may be formed over a first dielectric layer at the same time other features are formed. Thereafter, channel sidewalls 152 may be formed through a second dielectric layer at the same time vias 120 are formed. For example, the channel sidewalls 152 may be substantially similar to the vias 120, with the exception of their shape. The channel sidewalls 152 may be considered elongated vias or line vias. The process for forming the channel sidewalls 152 is described in greater detail below.

In order to allow for fluids to enter and exit the microchannel 162, embodiments include forming inlets/outlets 125. In the embodiment illustrated in FIG. 1A, the inlets/outlets 125 are both formed through a top channel wall 154. In the illustrated embodiment, it appears that the top channel wall 154 is floating, however it is to be appreciated that the top channel wall 154 is supported by the channel sidewalls 152 in other planes not visible in this particular cross-sectional view. The supporting structures for the top channel wall 154 are illustrated in greater detail below.

In addition to the inlets/outlets 125, embodiments of the invention may also include inlet/outlet fittings 156. The inlet/outlet fittings 156 may be a tube, an O-ring, or any other suitable gasket that allows for the microchannel 162 to be fluidly coupled to a second device. For example, the inlet/outlet fittings 156 may allow for the microchannel 162 to be fluidly coupled to other devices that include fluid channels such as, packaged sensors, heat sinks, dies with fluid channels, other packaging substrates with fluid channels, or the like. Embodiments of the invention may also use the inlet/outlet fittings 156 to transfer a fluid from a first device to a second device. For example, an inlet fitting 156 may be fluidly coupled to a first device and the outlet fitting 156 may be coupled to a second device. In an embodiment, the fittings 156 may be formed through an additional dielectric layer 107. For example, the additional dielectric layer 107 may be a solder resist material.

Figure 1B:
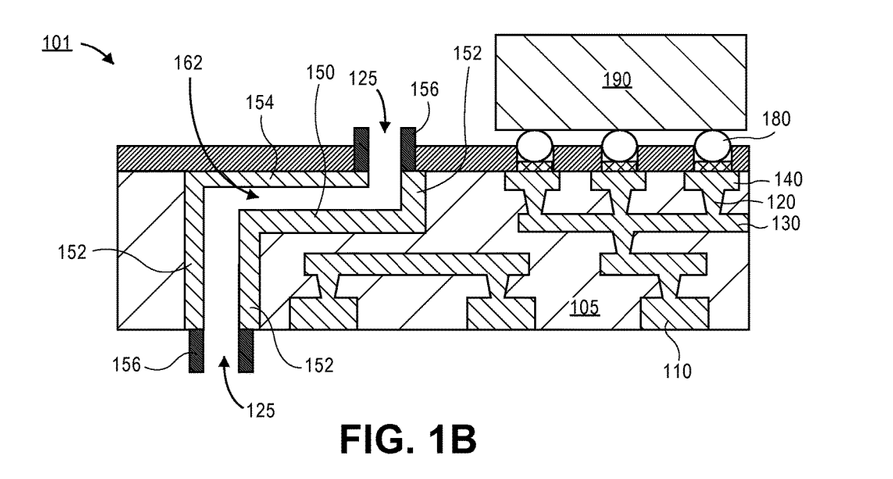
FIG. 1B is a cross-sectional illustration of a package substrate that includes a microchannel with an inlet and an outlet formed on opposite sides of the package, according to an embodiment of the invention.

While FIG. 1A illustrates that the inlets/outlets 125 are both formed on the same side of the packaged device 100, embodiments are not limited to such configurations. For example, FIG. 1B provides a cross-sectional illustration of a packaged device 101 that includes a first inlet/outlet 125 formed on the top surface of the dielectric layers 105 (or the package substrate) and a second inlet/outlet 125 on the bottom surface of the dielectric layers 105. In FIG. 1B the PCB is omitted in order to not unnecessarily obscure embodiments of the invention. Such embodiments allow for the microchannel 162 to carry fluid throughout the different layers of the package substrate. This provides enhanced thermal management abilities. For example, in embedded die applications, the embedded die may be cooled by passing a microchannel proximate to the embedded die within the dielectric layers 105. Additionally, the bottom portions of a package device 101 may be harder to cool, and therefore may benefit from the presence of a microchannel 162 that provides a flow of cooling fluid through the bottom portion of the packaged device 101.

Figure 1C:
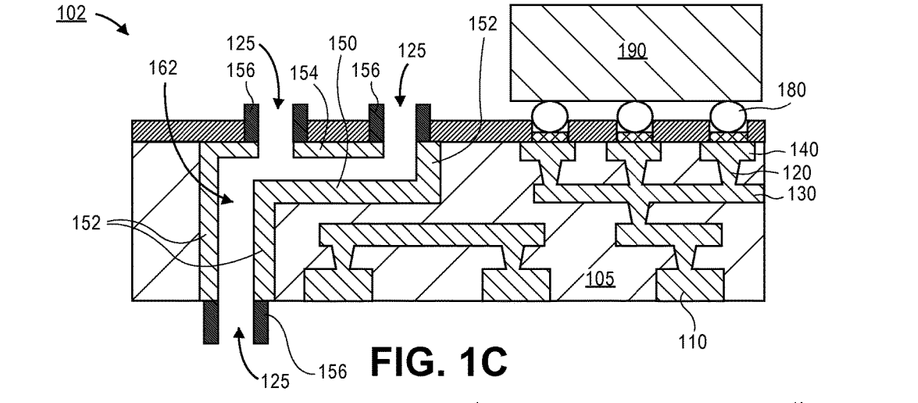
FIG. 1C is a cross-sectional illustration of a package substrate that includes more than two inlets/outlets, according to an embodiment of the invention.

Additional embodiments of the invention may include more than two inlets/outlets 125. Such an embodiment is illustrated in FIG. 1C. As illustrated, a single microchannel 162 may have a plurality of inlets/outlets 125 that are formed on different surfaces of the packaged device 102. Increasing the number of inlets/outlets 125 may allow for the microchannel 162 to be fluidly coupled to a plurality of different structures that include fluid channels. As such there is additional design flexibility in the design of the packaged device 102.

The ability to form the microchannels such as those described with respect to FIGS. 1A-1C is made possible by using various via patterning processes. The improved via patterning processes, such as the ones described herein, allow for the vias to be formed in any desired shape instead of being limited in shape, as is the case with laser drilled vias currently used to form build-up structures. As such, embodiments of the invention provide vias that extend a length suitable to form a wall for the channel. A process for forming channels in a package substrate according to embodiments of the invention are illustrated and described with respect to FIGS. 2A-2H.

Figure 2A:
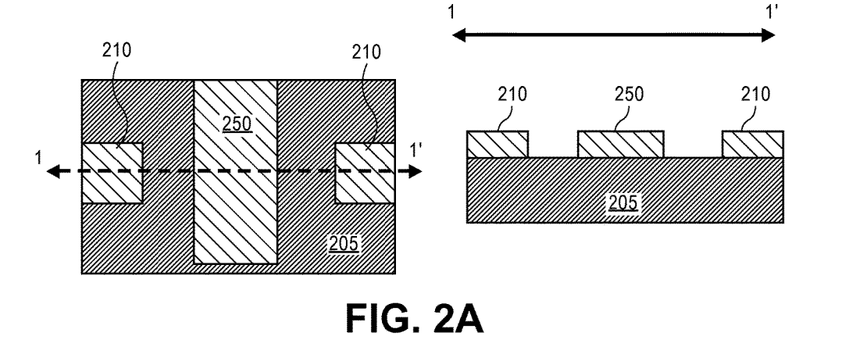
FIG. 2A is a plan view and a corresponding cross-sectional illustration of a package substrate with via pads and a bottom channel wall formed over the surface of a dielectric layer, according to an embodiment of the invention.

Referring now to FIG. 2A, a plan view and a corresponding cross-sectional view of a package substrate are illustrated, according to an embodiment of the invention. The package substrate may include a dielectric layer 205. By way of example, the dielectric layer 205 may be a polymer material, such as, for example, polyimide, epoxy, or build-up film (BF). In an embodiment, the dielectric layer 205 may be one layer in a stack that includes a plurality of dielectric layers used to form a build-up structure. As such, the dielectric layer 205 may be formed over another dielectric layer. Additional embodiments may include forming the dielectric layer 205 as the first dielectric layer over a core material on which the stack is formed.

Embodiments of the invention include forming a bottom channel wall 250 and any other features needed on the dielectric layer 205. For example, conductive traces (not shown) or via pads 210 may also be formed over a top surface of the dielectric layer 205. In the illustrated embodiment, the bottom channel wall 250 is rectangular in shape, however, embodiments are not limited to such configurations. The bottom channel wall 250 provides a base on which the remaining portions of the microchannel will be formed.

In an embodiment, the bottom channel wall 250 and the via pads 210 may be formed with a lithography process. For example, a seed layer (not shown) may be deposited over the entire surface of the dielectric layer 205. A photoresist material may then be deposited over the seed layer and patterned to provide openings for the formation of bottom channel wall 250 and the via pads 210. According to an embodiment, the patterning of the photoresist material may be implemented with lithographic processes (e.g., exposed with a radiation source through a mask (not shown) and developed with a developer). After the photoresist material has been patterned, the bottom channel wall 250 and the via pads 210 may be formed with an electroplating process or the like. The photoresist material may then be removed and the portions of the seed layer that were covered by the photoresist material may be removed with a seed etching process.

Figure 2B:
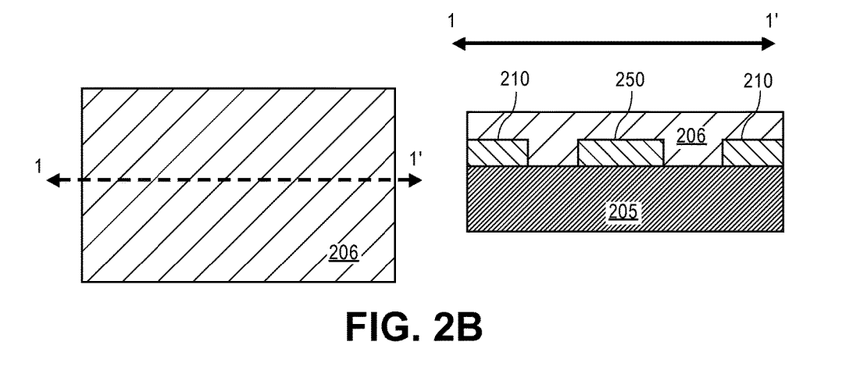
FIG. 2B is a plan view and a corresponding cross-sectional illustration of the package substrate after a second dielectric layer is formed over the via pads and the bottom channel wall, according to an embodiment of the invention.

Referring now to FIG. 2B, embodiments of the invention may include forming a second dielectric layer 206 over the first dielectric layer 205, the bottom channel wall 250 and the via pads 210. The second dielectric layer 206 may be formed to a thickness that provides the desired height for the channel sidewalls formed in a subsequent processing operation. According to an embodiment, the second dielectric layer 250 may be formed with any suitable process, such as lamination or slit coating and curing.

Figure 2C:
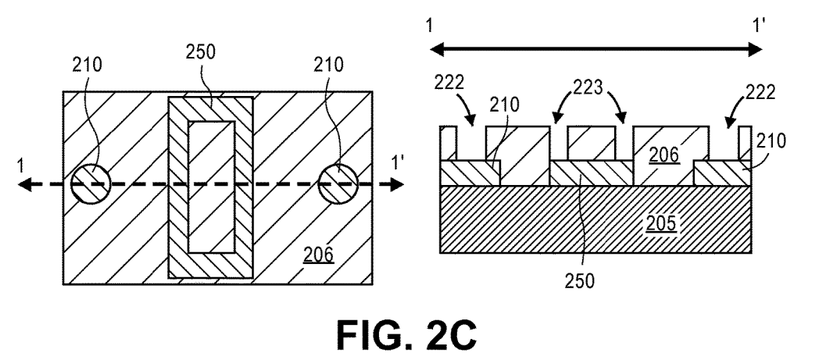
FIG. 2C is a plan view and a corresponding cross-sectional illustration of the package substrate after via openings and channel sidewall openings are patterned into the second dielectric layer, according to an embodiment of the invention.

Referring now to FIG. 2C, embodiments of the invention include patterning the second dielectric layer to form channel sidewall openings 223 and via openings 222. In one embodiment of the invention, the channel sidewall openings 223 and the via openings 222 may be formed with a lithography process. For example, a photoresist material may be deposited over the second dielectric layer 206 and patterned to form an etch mask for the channel sidewall openings 223 and the via openings 222. The second dielectric layer 206 is then patterned using the photoresist as a mask in order to transfer the channel sidewall openings 223 and the via openings 222 into the second dielectric layer 206. Embodiments of the invention include an anisotropic etching process that provides substantially vertical sidewalls for the channel sidewall openings 223 and the via openings 222. For example, the second dielectric layer 206 is etched with a dry etching process, such as a plasma etch.

As illustrated in the plan view in FIG. 2C, the via openings 222 are substantially circular. However, additional embodiments are not limited to such configurations. For example, the via openings 222 may be elongated, rectangular, or any other desired shape. According to an embodiment, one or more via openings 222 may be formed with different shapes and/or sizes. Additionally, the channel sidewall openings 223 may be formed in any desired pattern, according to various embodiments. In the illustrated embodiment, the channel sidewall openings 223 are formed with a top-down footprint that substantially matches the top-down footprint of the bottom channel wall 250. In order to account for misalignment between layers, the channel sidewall openings 223 may be formed with a smaller top-down footprint than the bottom channel wall 250. As such, even if the channel sidewall openings 223 are misaligned, they will still land within the perimeter of the bottom channel wall 250.

Figure 2D:
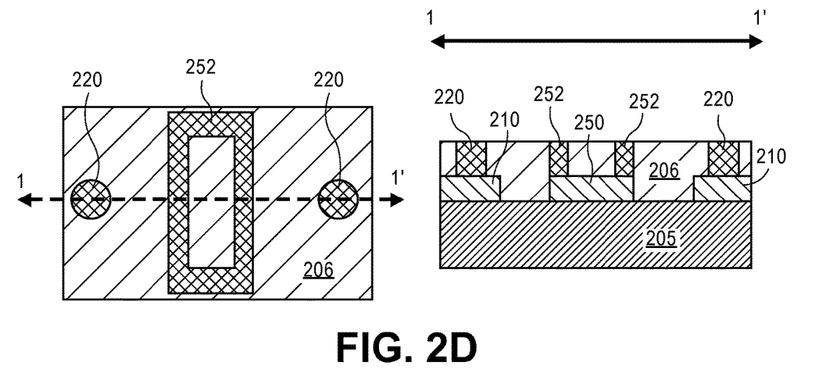
FIG. 2D is a plan view and a corresponding cross-sectional illustration of the package substrate after vias are formed in the via openings and channel sidewalls are formed in the channel sidewall openings, according to an embodiment of the invention.

Referring now to FIG. 2D, the channel sidewalls 252 and the vias 220 may be formed in the openings, according to an embodiment. In some embodiments, a blanket seed layer (not shown) may be formed first, followed by a lithography process to deposit and pattern a photoresist layer (e.g. dry film photoresist) to define the locations to be plated (e.g., the channel sidewall openings 223 and via openings 222), followed by a metal deposition process to plate those features. For example, the metal deposition process may be an electroplating process or the like. In such an embodiment, the blanket seed layer deposition may result in a top surface of the second dielectric layer 206 being covered with metal in locations that are not intended to be plated. As such, a seed layer etching process may be implemented after plating and resist stripping to remove any remaining seed layer from those locations. According to an additional embodiment, the growth of the channel sidewalls 252 and the vias 220 may be a controlled growth that is stopped before the top surfaces of the channel sidewalls 252 and the vias 220 extend above the top surface of the second dielectric layer 206. Controlling the growth of the channel sidewalls 252 and the vias 220 may prevent the formation of any overburden along the top surface of the second dielectric layer 206.

Figure 2E:
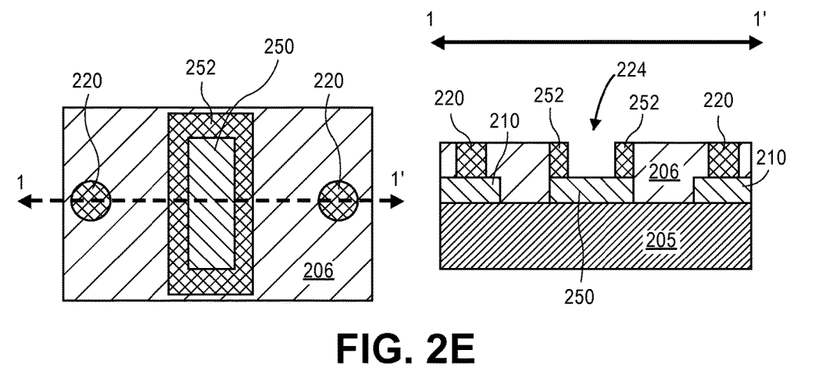
FIG. 2E is a plan view and a corresponding cross-sectional illustration of the package substrate after a portion of the second dielectric layer within the channel sidewalls is removed to form a channel opening, according to an embodiment of the invention.

Referring now to FIG. 2E, embodiments of the invention include removing the portion of the second dielectric layer 206 that is formed between the channel sidewalls 252 to form a channel opening 224. Forming the channel opening 224 exposes the bottom channel wall 250. According to an embodiment, the dielectric material between the channel sidewalls 252 may be removed by depositing a photoresist material and patterning the photoresist to expose the region of the dielectric layer 206 between the channel sidewalls 252. The photoresist may then function as an etch mask that allows for only the dielectric material within the channel sidewalls 252 to be removed. In some embodiments of the invention, a surface coating may be applied to the exposed channel sidewalls 252 and the surface of the bottom channel wall 250 after the second dielectric layer 206 is removed. Surface coatings may include corrosion inhibitors, or the like.

Figure 2F:
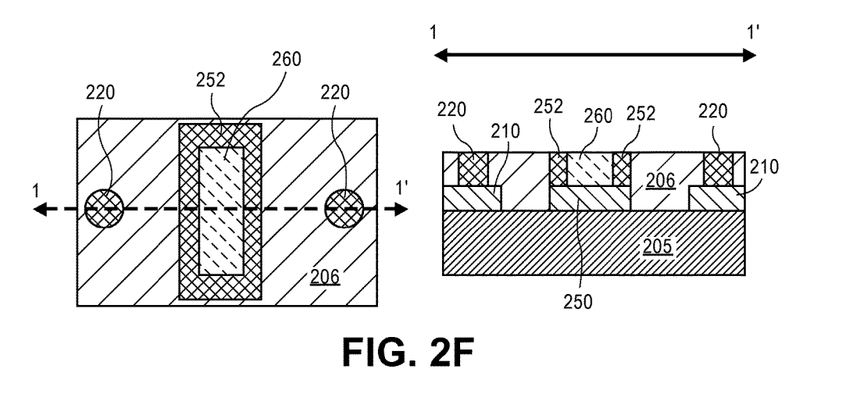
FIG. 2F is a plan view and a corresponding cross-sectional illustration of the package substrate after a sacrificial material is deposited in the channel opening, according to an embodiment of the invention.

Referring now to FIG. 2F, embodiments of the invention may include disposing a sacrificial material 260 into the channel opening 224. According to an embodiment, the sacrificial material 260 is a material that can function as a removable core for the microchannel. For example, the sacrificial material 260 must be structurally sound, so that the subsequently formed top channel wall does not collapse into the channel opening 224. Additionally, the sacrificial material 260 needs to be able to be removed through the inlets and/or outlets of the channel after the top channel wall is formed. In one embodiment, the sacrificial material 260 may be a thermally decomposable material. Embodiments of the invention may include disposing the sacrificial material 260 into the channel opening 224 with any suitable dispensing process, such as screen printing, slit coating, or needle dispensing. After deposition, a soft bake of the sacrificial material 224 may be implemented in order to harden the sacrificial material 260 so that it is structurally sound. The sacrificial material 260 may be soft baked at temperatures below approximately 150° C. In one embodiment, the sacrificial material 260 may be soft baked at a temperature that is approximately 110° C. For example, one suitable material for the sacrificial material 260 may be polypropylene carbonate (PPC).

According to an additional embodiment, the sacrificial material 260 may be a soluble material. For example, a water soluble polymer or a polymer that is dissolved in solvents such as acetone or isopropanol may be used. In such embodiments, the sacrificial material is structurally stable while the microchannel is being formed. After the microchannel is completed, the sacrificial material 260 may be removed by flowing the solvent through the microchannel. In yet another embodiment, where the path of the microchannel is oriented only in the vertical direction, the sacrificial material 260 may be the same material as the dielectric material. In such an embodiment, the sacrificial material 260 may be removed with a mechanical process (e.g., laser drilling or etching) after the microchannel has been completed.

Figure 2G:
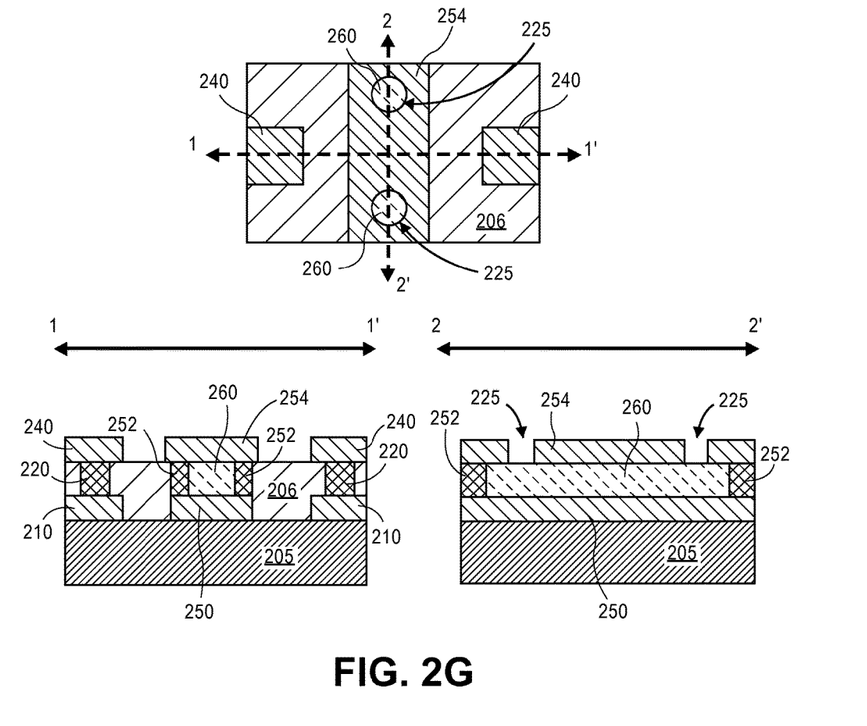
FIG. 2G is a plan view and two corresponding cross-sectional illustrations of the package substrate after pads are formed over the vias and a top channel wall is formed over the sacrificial material, according to an embodiment of the invention.

Referring now to FIG. 2G, a plan view and two corresponding cross-sectional views are illustrated, according to an embodiment of the invention. In FIG. 2G, embodiments of the invention include forming the top channel wall 254 over the channel sidewalls 252. In order to account for potential misalignment in the patterning of the top channel wall 254, the top-down footprint of the top channel wall 254 may be greater than the top-down footprint of the channel sidewalls 252. Accordingly, even when the top channel wall is misaligned, the channel will still be completely sealed. As illustrated in the plan-view and the cross-sectional view along line 2-2', embodiments of the invention may also include patterning one or more inlets/outlets 225. In the illustrated embodiment, the inlets/outlets 225 are depicted as being circular, but embodiments are not limited to such configurations. For example, the inlets/outlets 225 may be any suitable shape or size. Additional embodiments include inlets/outlets 225 that are not the same size or shape as each other. The inlets/outlets 225 may be positioned at any location on the top channel wall 254. In the illustrated embodiment, inlets/outlets 225 are positioned at opposite ends of the top channel wall 254. Additional embodiments may include forming a single inlet/outlet 225 on the top channel wall 254. Such embodiments may be beneficial when the channel passes through more than one layer of the package substrate and a second inlet/outlet 225 is formed at a different surface (e.g., as illustrated in FIG. 1B).

According to an embodiment, the top channel wall 254 may be formed at the same time a pad 240 is formed over each of the vias 220. For example, the top channel wall 254 and the pads 240 may each be formed with a seed layer deposition, lithography, and metal deposition process. In an embodiment, a blanket seed layer may be deposited over the exposed surfaces of dielectric 206, vias 220, channel sidewalls 252, and sacrificial material 260 in FIG. 2F. Then photoresist material (not shown) may be deposited over the seed layer and patterned to form openings in which the top channel wall 254 and the pads 240 may be formed in with a metal deposition process, such as an electroplating process or the like. It is to be appreciated that other features, such as conductive lines, may also be patterned and formed over the second dielectric layer 206 as well. After the metal deposition process, the photoresist material may be removed, and any remaining seed layer formed may be etched away. According to an embodiment, the metal deposition and patterning may also include the formation of the inlets/outlets 225 that expose a portion of the sacrificial material 260. Accordingly, the sacrificial material 260 has one or more pathways through which it may be removed from the microchannel.

Figure 2H:
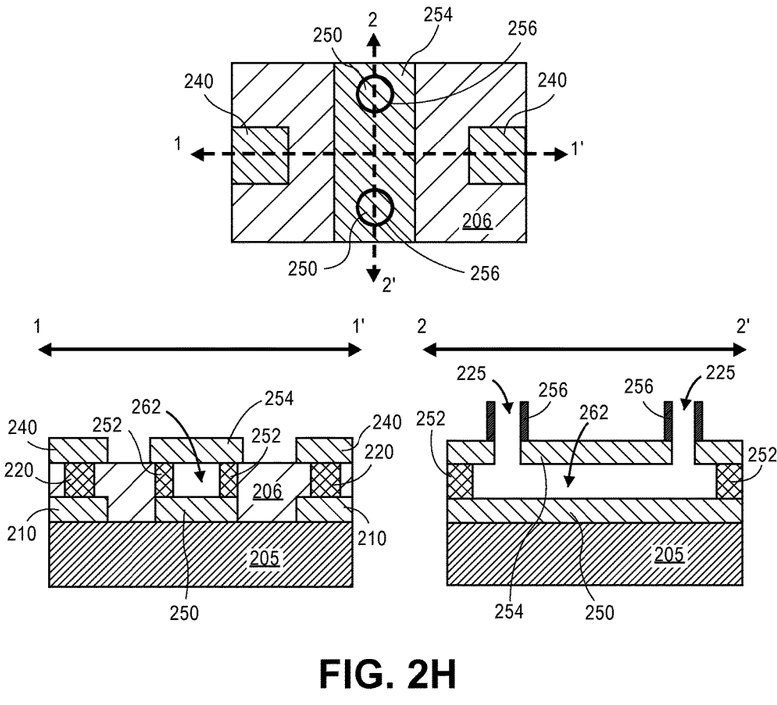
FIG. 2H is a plan view and two corresponding cross-sectional illustrations of the package substrate after the sacrificial material is removed from the channel and fittings are attached to the inlet and outlet, according to an embodiment of the invention.

Referring now to FIG. 2H, embodiments of the invention include removing the sacrificial material 260 and placing inlet/outlet fittings 256 over the inlets/outlets 225. The removal of the sacrificial material provides a hollow pathway that may be used as a microchannel 262 for transporting liquids or gases through the package substrate. In embodiments where the sacrificial material 260 is a thermally decomposable material, the sacrificial material 260 may be removed by heating the package substrate. The package substrate may be heated to a temperature that is less than the reflow temperature. For example, the package substrate may be heated to a temperature between approximately 180° C. and approximately 250° C. The package substrate may be held at the elevated temperature until all of the sacrificial material 260 is removed. At higher temperatures (e.g., close to the reflow temperature), the sacrificial material 260 may be cleared in several minutes, whereas lower temperatures (e.g., below 200° C.) may require an hour or more to completely clear the sacrificial material 260.

According to an embodiment, the fittings 256 may be mounted to the inlets/outlets 225 in order to provide improved coupling between external components. For example, the fittings 256 may allow for the attachment of the microchannel 262 to other fluid channels in devices such as, packaged sensors, heat sinks, dies with fluid channels, other packaging substrates with fluid channels, or the like. In an embodiment, the fittings 256 may be tubing, O-rings, or other types of gaskets. Embodiments include attaching the fittings 256 to the inlets/outlets 225 by gluing them to the top channel wall 254 with a suitable glue, such as an epoxy.

In the process flow described above with respect to FIGS. 2A-2H the second dielectric layer 206 was formed and then the channel sidewalls 252 were formed in openings formed through the second dielectric layer 206. However, embodiments are not limited to such configurations. For example, the channel sidewalls may be formed before the second dielectric layer is formed. Processes for forming microchannels in accordance with such embodiments are described with respect to FIGS. 3A-3E.

Figure 3A:
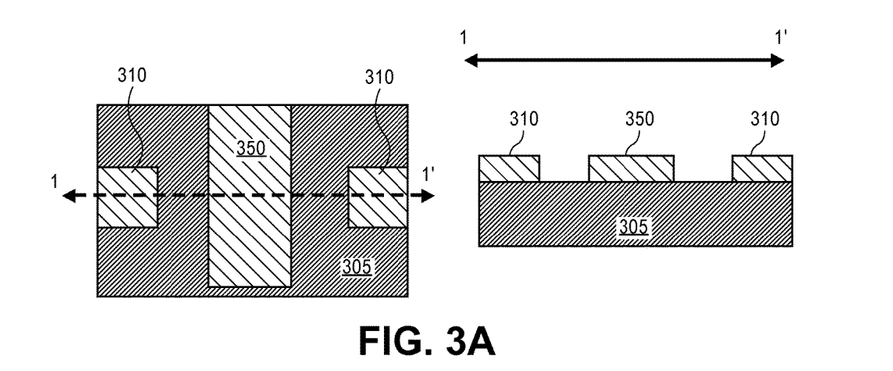
FIG. 3A is a plan view and a corresponding cross-sectional illustration of a package substrate with via pads and a bottom channel wall formed over the surface of a dielectric layer, according to an embodiment of the invention.

Referring now to FIG. 3A, a plan view and a corresponding cross-sectional view of a package substrate are illustrated, according to an embodiment of the invention. The package substrate may include a dielectric layer 305. By way of example, the dielectric layer 305 may be a polymer material, such as, for example, polyimide, epoxy or BF. In an embodiment, the dielectric layer 305 may be one layer in a stack that includes a plurality of dielectric layers used to form a build-up structure. As such, the dielectric layer 305 may be formed over another dielectric layer. Additional embodiments may include forming the dielectric layer 305 as the first dielectric layer over a core material on which the stack is formed.

In an embodiment the bottom channel wall 350 and any other features needed on the dielectric layer 305 are formed. For example, conductive traces (not shown) or via pads 310 may be formed over a top surface of the dielectric layer 305. In the illustrated embodiment, the bottom channel wall 350 is rectangular in shape, however, embodiments are not limited to such configurations. The bottom channel wall 350 provides a base on which the remaining portions of the microchannel will be formed. Accordingly, the dimensions and shape of the bottom channel wall 350 may be any desired geometry.

In an embodiment, the bottom channel wall 350 and the via pads 310 may be formed with a lithography process. The process for forming the bottom channel wall 350 and the via pads 310 may be substantially similar to the process described above with respect to FIG. 2A, and therefore will not be repeated here.

Figure 3B:
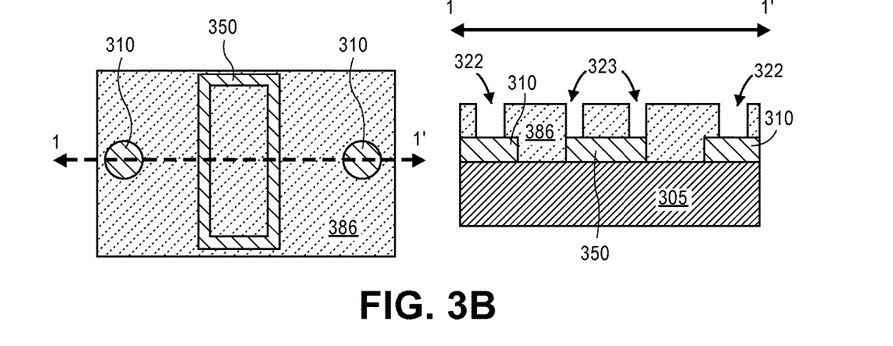
FIG. 3B is a plan view and a corresponding cross-sectional illustration of the package substrate after a photoresist layer is deposited and patterned to form channel sidewall openings and via openings, according to an embodiment of the invention.

Referring now to FIG. 3B, a photoresist material 386 is deposited over the conductive bottom channel wall 350 and the via pads 310. According to an embodiment, channel sidewall openings 323 and via openings 322 may then be patterned into the photoresist material 386 by exposing the photoresist material 386 to radiation through a mask (not shown) and developing the photoresist material 386 with a developer. As shown in the cross-sectional views in FIG. 3B, embodiments of the invention include channel sidewall openings 323 and via openings 322 that have substantially vertical sidewalls. As illustrated in the plan view in FIG. 3B, the via openings 322 are substantially circular. However, additional embodiments are not limited to such configurations. For example, the via openings 322 may be elongated, rectangular, or any other desired shape. According to an embodiment, one or more via openings 322 may be formed with different shapes and/or sizes. Additionally, the channel sidewall openings 323 may be formed in any desired pattern, according to various embodiments. In the illustrated embodiment, the channel sidewall openings 323 are formed with a top-down footprint that substantially matches the top-down footprint of the bottom channel wall 350. In order to account for misalignment between layers, the channel sidewall openings 323 may be formed with a smaller top-down footprint than the bottom channel wall 350. As such, even if the channel sidewall openings 323 are misaligned, they will still land within the perimeter of the bottom channel wall 350.

Figure 3C:
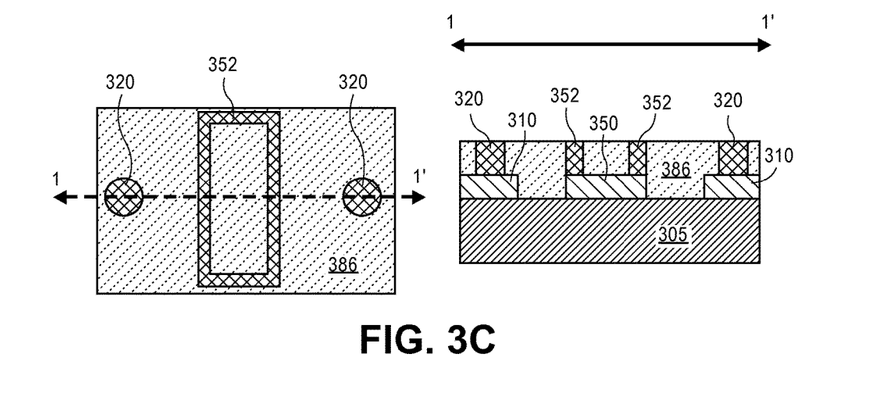
FIG. 3C is a plan view and a corresponding cross-sectional illustration of the package substrate after the channel sidewalls and the vias are formed in the openings, according to an embodiment of the invention.

Referring now to FIG. 3C, the channel sidewalls 352 and the vias 320 may be formed in the openings, according to an embodiment. In some embodiments, a seed layer (not shown) may be formed first, followed by a metal deposition process. For example, the metal deposition process may be an electroplating process or the like. In such an embodiment, the blanket deposition of the metal may result in a top surface of the photoresist material 386 being covered with metal. As such, an etching process may be implemented to remove any overburden and produce channel sidewalls 352 and vias 320 that include top surfaces that are substantially planar with a top surface of the photoresist material 386. According to an additional embodiment, the growth of the channel sidewalls 352 and the vias 320 may be a controlled growth that is stopped before the top surfaces of the channel sidewalls 352 and the vias 320 extend above the top surface of the photoresist material 386. Controlling the growth of the channel sidewalls 352 and the vias 320 may prevent the formation of any overburden along the top surface of the photoresist material 386.

Figure 3D:
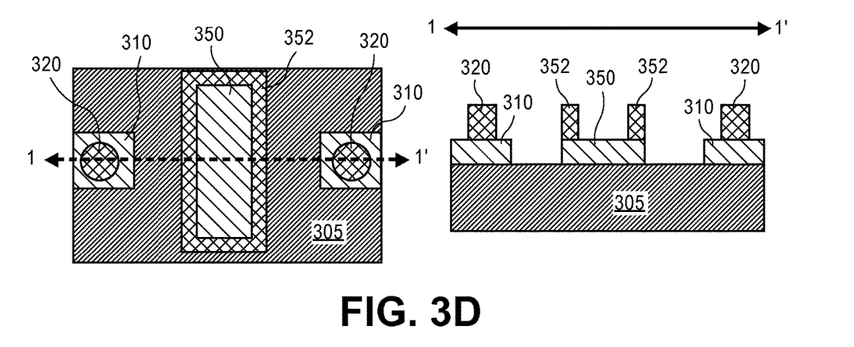
FIG. 3D is a plan view and a corresponding cross-sectional illustration of the package substrate after the photoresist material is removed, according to an embodiment of the invention.

Referring now to FIG. 3D, the photoresist material 386 is stripped to leave the channel sidewalls 352 and the vias 320. As shown in the illustrated embodiment, the channel sidewalls 352 and the vias 320 are formed prior to the formation of the second dielectric layer.

Figure 3E:
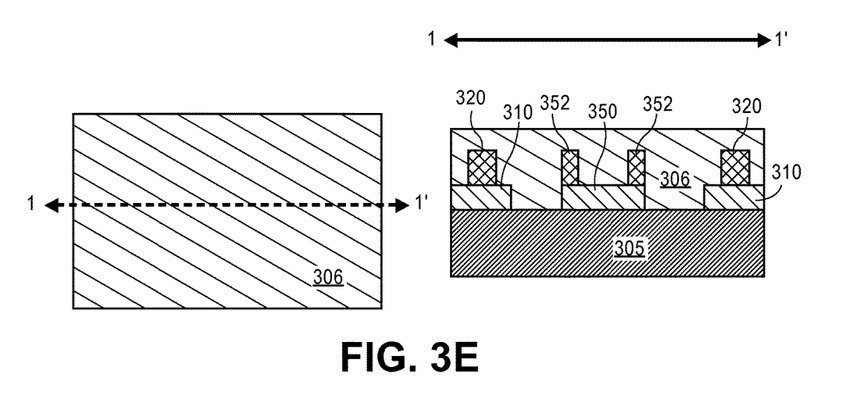
FIG. 3E is a plan view and a corresponding cross-sectional illustration of the package substrate after a second dielectric layer is formed over the channel sidewalls and the vias, according to an embodiment of the invention.

Referring now to FIG. 3E, a second dielectric layer 306 is formed over the exposed via surfaces. According to an embodiment the second dielectric layer 306 may be formed with any suitable process, such as lamination or slit coating and curing. In an embodiment, the second dielectric layer 306 is formed to a thickness that will completely cover a top surface of the vias 320 and the channel sidewalls 352. As opposed to layer formation on crystalline structures (e.g., silicon substrates), each of the dielectric layers may not have a highly uniform thickness. Accordingly, the second dielectric layer 306 may be formed to a thickness that is greater than the vias 320 and the channel sidewalls 352 to ensure that the proper thickness is reached across the entire substrate. In some embodiments, the thickness of the second dielectric layer 306 may be minimized in order to reduce the etching time required to expose the vias 320 and the channel sidewalls 352 in a subsequent processing operation. In other embodiments, when the thickness of the dielectric layer can be well controlled, the channel sidewalls 352 and the vias 320 may extend above the top surface of the second dielectric layer 306. This may be beneficial because the subsequent controlled dielectric removal process described in FIG. 3F may be omitted.

Figure 3F:
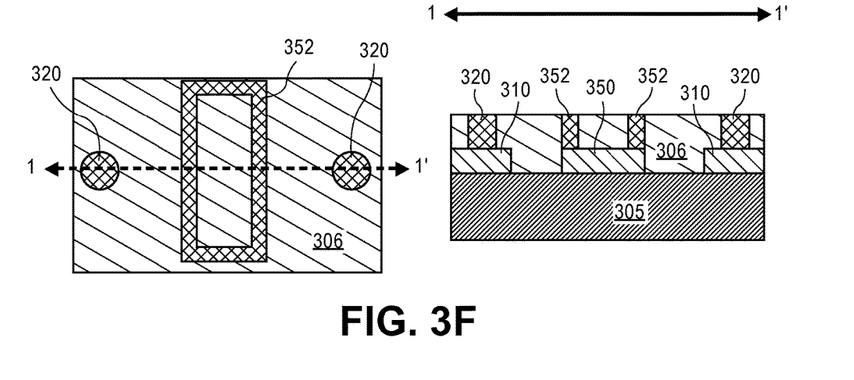
FIG. 3F is a plan view and a corresponding cross-sectional illustration of the package substrate after the second dielectric is recessed to expose a top portion of the vias and the channel sidewalls, according to an embodiment of the invention.

Referring now to FIG. 3F, a depth controlled dielectric removal process is performed to expose a top portion of the channel sidewalls 352 and the vias 320. In an embodiment, the top portions of the channel sidewalls 352 and the vias 320 may extend above the second dielectric layer 306. In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the channel sidewalls 352 and the vias 320. For example, laser ablation of the second dielectric layer 306 may be localized proximate to the location of the channel sidewalls 352 and the vias 320.

According to an embodiment, FIG. 3F is a device that is substantially similar to the device illustrated in FIG. 2D. As such, embodiments of the invention may continue forming the microchannel in substantially the same manner described above with respect to FIGS. 2E-2H, and therefore, will not be repeated here.

In the embodiments described above, the bottom channel wall is formed over a first dielectric layer. However, it is to be appreciated that embodiments are not limited to such configurations. For example, the bottom most layer of a package may be metallic layer. In such an embodiment, the microchannel may be formed on the bottom most layer with no dielectric supporting layer. In such an embodiment, the bottom channel wall may be a portion of a bottom most layer of the package, or a bottom channel wall may be formed over the metal bottom most layer of the package.

Figure 4:
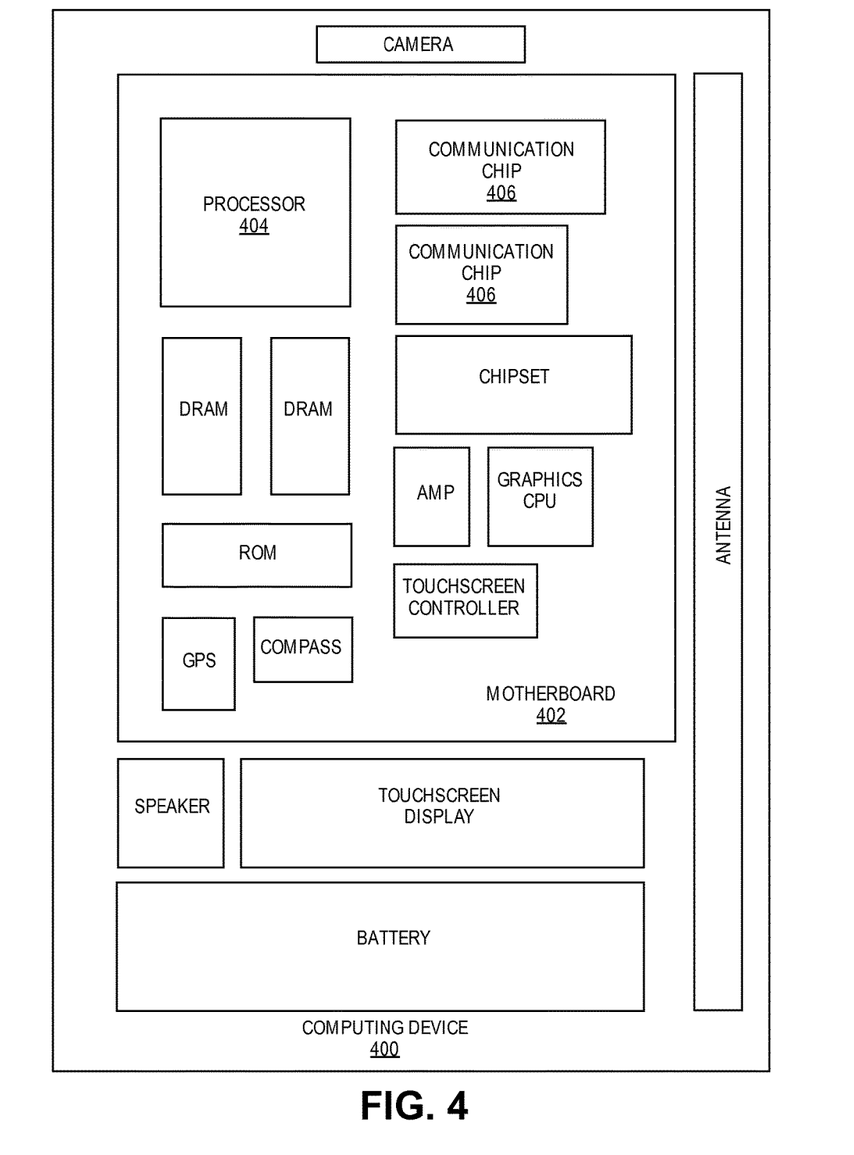
FIG. 4 is a schematic of a computing device built in accordance with an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as devices that include microchannels that are lithographically patterned in a package substrate in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as devices that include microchannels that are lithographically patterned in a package substrate in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a package substrate that comprises: a first package layer; a bottom channel wall formed on the first package layer; a channel sidewall that is formed in contact with the bottom channel wall; an organic dielectric layer formed over the first package layer, wherein the dielectric layer is not present within a perimeter of the channel sidewall; and a top channel wall supported by the channel sidewall, wherein the top channel wall, the channel sidewall, and the bottom channel wall define a microchannel.

Additional embodiments of the invention may further comprise a plurality of inlets/outlets. Additional embodiments of the invention include a package substrate, wherein a first inlet/outlet and a second inlet/outlet are formed through the top channel wall.

Additional embodiments of the invention include a package substrate, wherein a first inlet/outlet is formed through the top channel wall, and a second inlet/outlet is formed through the bottom channel wall.

Additional embodiments of the invention include a package substrate that further comprises a fitting formed over each of the plurality of inlets/outlets.

Additional embodiments of the invention include a package substrate, wherein the fitting is an O-ring.

Additional embodiments of the invention include a package substrate, wherein a surface of the microchannel includes a surface coating.

Additional embodiments of the invention include a package substrate, wherein the microchannel is part of a thermal management system.

Additional embodiments of the invention include a package substrate, wherein the microchannel is formed proximate to an embedded chip.

Additional embodiments of the invention include a package substrate, wherein the microchannel is part of a microfluidic path fluidly coupled to a sensor.

Additional embodiments of the invention include a package substrate, wherein the microchannel is fluidly coupled to one or more devices external to the package substrate.

Additional embodiments of the invention include a package substrate, wherein the channel sidewalls extend through more than one dielectric layer.

Embodiments of the invention include a method of forming a microchannel in a package substrate, that comprises: forming a bottom channel wall over a first package layer; forming an organic dielectric layer over the bottom channel wall and the first package layer; patterning the dielectric layer to form a channel sidewall opening; depositing a conductive material into the channel sidewall opening to form a channel sidewall; removing a portion of the dielectric layer formed inside a perimeter of the channel sidewall; disposing a sacrificial material inside the perimeter of the channel sidewall; forming a top channel wall over a top surface of the sacrificial material and in contact with a top surface of the channel sidewall; and removing the sacrificial material through an inlet/outlet formed in the top channel wall.

Additional embodiments include a method of forming a microchannel in a package substrate, wherein patterning the dielectric layer comprises: depositing a hardmask layer over the dielectric layer; patterning the hardmask layer to form a channel sidewall opening in the hardmask layer; and transferring the sidewall channel opening in the hardmask layer to the dielectric layer with a dry etching process.

Additional embodiments include a method of forming a microchannel in a package substrate, wherein a surface coating is applied to the bottom channel wall and the channel sidewall prior to disposing the sacrificial material inside the perimeter of the channel wall.

Additional embodiments include a method of forming a microchannel in a package substrate, that further comprises: soft baking the sacrificial material after it has been disposed inside the perimeter of the channel wall.

Additional embodiments include a method of forming a microchannel in a package substrate, wherein the sacrificial material is removed by heating the package substrate to a temperature that thermally decomposes the sacrificial material.

Additional embodiments include a method of forming a microchannel in a package substrate, that further comprises: attaching a fitting to the inlet/outlet.

Additional embodiments include a method of forming a microchannel in a package substrate, wherein the channel sidewall opening is formed at the same time a plurality of via openings are formed through the dielectric layer.

Embodiments of the invention include a method of forming a microchannel in a package substrate, that comprises: forming a bottom channel wall over a first package layer; depositing a photoresist layer over the first package layer and the bottom channel wall; patterning the photoresist layer to form a channel sidewall opening over the bottom channel wall; depositing a conductive material into the channel sidewall opening to form a sidewall over the bottom channel wall; removing the photoresist layer; forming an organic dielectric layer over the first package layer, the bottom channel wall, and the channel sidewall; removing a portion of the dielectric layer formed inside a perimeter of the channel sidewall; disposing a sacrificial material inside the perimeter of the channel sidewall; forming a top channel wall over a top surface of the sacrificial material and in contact with a top surface of the channel sidewall; and removing the sacrificial material through an inlet/outlet formed in the top channel wall.

Additional embodiments include a method of forming a microchannel in a package substrate, wherein a top surface of the dielectric layer is formed above a top surface of the channel sidewall.

Additional embodiments include a method of forming a microchannel in a package substrate, that further comprises: recessing the dielectric layer to expose a top portion of the channel sidewall.

Additional embodiments include a method of forming a microchannel in a package substrate, wherein recessing the second dielectric layer includes a wet etch, a dry etch, a wet blast, or a laser ablation process.

Additional embodiments include a method of forming a microchannel in a package substrate, wherein the recessing is only implemented proximate to the channel sidewall.

Additional embodiments include a method of forming a microchannel in a package substrate, that further comprises: soft baking the sacrificial material after it has been disposed inside the perimeter of the channel wall.

Additional embodiments include a method of forming a microchannel in a package substrate, wherein the sacrificial material is removed by heating the package substrate to a temperature that thermally decomposes the sacrificial material.

Additional embodiments include a method of forming a microchannel in a package substrate, wherein a surface coating is applied to the bottom channel wall and the channel sidewall prior to disposing the sacrificial material inside the perimeter of the channel wall.

Additional embodiments include a method of forming a microchannel in a package substrate, wherein the channel sidewall opening is formed at the same time a plurality of via openings are formed through the second dielectric layer.

Additional embodiments include a method of forming a microchannel in a package substrate, that further comprises: attaching a fitting to the inlet/outlet.

What is claimed is:

1. A package substrate comprising:
   a first package layer;
   a bottom channel wall formed on the first package layer;
   a channel sidewall that is formed in contact with the bottom channel wall;
   an organic dielectric layer formed over the first package layer, wherein the dielectric layer is not present within a perimeter of the channel sidewall; and
   a top channel wall supported by the channel sidewall, wherein the top channel wall, the channel sidewall, and the bottom channel wall define a microchannel.

2. The package substrate of claim 1, further comprising a plurality of inlets/outlets.

3. The package substrate of claim 2, wherein a first inlet/outlet and a second inlet/outlet are formed through the top channel wall.

4. The package substrate of claim 2, wherein a first inlet/outlet is formed through the top channel wall, and a second inlet/outlet is formed through the bottom channel wall.

5. The package substrate of claim 2, further comprising a fitting formed over each of the plurality of inlets/outlets.

6. The package substrate of claim 5, wherein the fitting is an O-ring.

7. The package substrate of claim 1, wherein a surface of the microchannel includes a surface coating.

8. The package substrate of claim 1, wherein the microchannel is part of a thermal management system.

9. The package substrate of claim 8, wherein the microchannel is formed proximate to an embedded chip.

10. The package substrate of claim 1, wherein the microchannel is part of a microfluidic path fluidly coupled to a sensor.

11. The package substrate of claim 1, wherein the microchannel is fluidly coupled to one or more devices external to the package substrate.

12. The package substrate of claim 1, wherein the channel sidewall extends through more than one dielectric layer.

13. A method of forming a microchannel in a package substrate, comprising:
    forming a bottom channel wall over a first package layer;
    forming an organic dielectric layer over the bottom channel wall and the first package layer;
    patterning the dielectric layer to form a channel sidewall opening;
    depositing a conductive material into the channel sidewall opening to form a channel sidewall;
    removing a portion of the dielectric layer formed inside a perimeter of the channel sidewall;
    disposing a sacrificial material inside the perimeter of the channel sidewall;
    forming a top channel wall over a top surface of the sacrificial material and in contact with a top surface of the channel sidewall; and
    removing the sacrificial material through an inlet/outlet formed in the top channel wall.

14. The method of claim 13, wherein patterning the dielectric layer comprises:
    depositing a hardmask layer over the dielectric layer;
    patterning the hardmask layer to form a channel sidewall opening in the hardmask layer; and
    transferring the sidewall channel opening in the hardmask layer to the dielectric layer with a dry etching process.

15. The method of claim 13, wherein a surface coating is applied to the bottom channel wall and the channel sidewall prior to disposing the sacrificial material inside the perimeter of the channel wall.

16. The method of claim 13, further comprising:
    soft baking the sacrificial material after it has been disposed inside the perimeter of the channel wall.

17. The method of claim 13, wherein the sacrificial material is removed by heating the package substrate to a temperature that thermally decomposes the sacrificial material.

18. The method of claim 13, further comprising:
    attaching a fitting to the inlet/outlet.

19. The method of claim 13, wherein the channel sidewall opening is formed at the same time a plurality of via openings are formed through the dielectric layer.

20. A method of forming a microchannel in a package substrate comprising:
    forming a bottom channel wall over a first package layer;
    depositing a photoresist layer over the first package layer and the bottom channel wall;
    patterning the photoresist layer to form a channel sidewall opening over the bottom channel wall;
    depositing a conductive material into the channel sidewall opening to form a channel sidewall over the bottom channel wall;
    removing the photoresist layer;
    forming an organic dielectric layer over the first package layer, the bottom channel wall, and the channel sidewall;
    removing a portion of the dielectric layer formed inside a perimeter of the channel sidewall;
    disposing a sacrificial material inside the perimeter of the channel sidewall;
    forming a top channel wall over a top surface of the sacrificial material and in contact with a top surface of the channel sidewall; and
    removing the sacrificial material through an inlet/outlet formed in the top channel wall.

21. The method of claim 20, wherein a top surface of the dielectric layer is formed above the top surface of the channel sidewall.

22. The method of claim 21, further comprising:
    recessing the dielectric layer to expose a top portion of the channel sidewall.

23. The method of claim 20, further comprising:
    soft baking the sacrificial material after it has been disposed inside the perimeter of the channel sidewall.

24. The method of claim 20, wherein the sacrificial material is removed by heating the package substrate to a temperature that thermally decomposes the sacrificial material.

25. The method of claim 20, wherein a surface coating is applied to the bottom channel wall and the channel sidewall prior to disposing the sacrificial material inside the perimeter of the channel sidewall.

* * * * *